United States Patent
Kao et al.

(10) Patent No.: US 6,249,044 B1
(45) Date of Patent: Jun. 19, 2001

(54) OPAQUE METALLIZATION TO COVER FLIP CHIP DIE SURFACE FOR LIGHT SENSITIVE SEMICONDUCTOR DEVICES

(75) Inventors: Pai-Hsiang Kao, Saratoga; Nikhil Vishwanath Kelkar, Santa Clara, both of CA (US)

(73) Assignee: National Semiconductor Corp., Santa Clara, CA (US)

( * ) Notice: Subject to any disclaimer, the term of this patent is extended or adjusted under 35 U.S.C. 154(b) by 0 days.

(21) Appl. No.: 09/335,440

(22) Filed: Jun. 17, 1999

(51) Int. Cl.[7] .................................................. H01L 29/00
(52) U.S. Cl. .......................... 257/678; 257/772; 257/779; 257/786; 257/780; 257/782; 257/781; 257/784; 257/778
(58) Field of Search ..................... 257/778, 779, 257/772, 780, 781, 678

(56) References Cited

U.S. PATENT DOCUMENTS

| | | | |
|---|---|---|---|
| 4,205,099 | * | 5/1980 | Jones et al. .............................. 204/15 |
| 4,816,967 | * | 3/1989 | Landis .................................. 361/401 |
| 5,258,334 | | 11/1993 | Lantz, II . |
| 5,496,770 | * | 3/1996 | Park ...................................... 257/738 |
| 5,834,844 | | 11/1998 | Akagawa et al. . |
| 6,022,792 | * | 2/2000 | Ishii et al. ............................. 438/612 |
| 6,034,431 | * | 3/2000 | Goosen et al. ....................... 257/750 |
| 6,049,130 | * | 4/2000 | Housomi et al. ..................... 257/738 |

OTHER PUBLICATIONS

C4 Product Design Manual, Chapter 1—Technology Overview, Issue: A, pp. 1–5 through 1–8 (No date).

\* cited by examiner

*Primary Examiner*—Fetsum Abraham
(74) *Attorney, Agent, or Firm*—Beyer, Weaver & Thomas LLP

(57) ABSTRACT

A light shield is provided for light sensitive flip chip integrated circuits. The flip chip includes an under bump layer to portions of which solder bumps are attached. A separate portion of this under bump layer is used to provide the light shield. The light shield excludes ambient light from the most light sensitive portions of the circuit so that the electrical characteristics of the flip chip integrated circuit are not significantly altered when the flip chip is operated in ambient light.

14 Claims, 5 Drawing Sheets

OPAQUE METALLIZATION TO COVER FLIP CHIP DIE SURFACE FOR LIGHT SENSITIVE SEMICONDUCTOR DEVICES

CROSS REFERENCE TO RELATED APPLICATIONS

This application is related to commonly assigned U.S. patent application Ser. No. 09/031,167 filed Feb. 26, 1998 entitled, "Surface Mount Die: Wafer Level Chip Scale Package and Process for Making the Same" by Schaefer et al., which is incorporated herein by reference.

BACKGROUND OF THE INVENTION

The present invention pertains to semiconductor integrated circuits. This invention particularly pertains to flip chip integrated circuits, also known as flip chips. This invention more particularly pertains to light sensitive flip chips and to a flip chip structure that excludes ambient light. The manufacturing process for making integrated circuit chips is performed, not on individual integrated circuit chips, but rather on semiconductor wafers. At the present state of the art many thousands of integrated circuits may be formed on a silicon wafer whose diameter is eight inches. Each circuit is a structure that includes layers of insulator, conductor and semiconductor, each layer being patterned according to a circuit plan. Bonding pads are formed on the surface of the wafer so that each integrated circuit has bonding pads for input signals, output signals, supply voltage, and ground. The wafer is finally cut into a number of integrated circuit chips. Subsequently, each integrated circuit chip is individually processed, either being installed in an integrated circuit package, or being attached to some form of substrate.

In the manufacture of flip chips, some additional process steps are performed on the wafer, prior to the operation of cutting the wafer into individual flip chips. These process steps provide an elevated bump on each bonding pad. Typically, these raised bumps are solder bumps.

A flip chip is attached to a substrate, such as a printed circuit board, by bringing the solder bumps into contact with metal traces on the substrate and then, in one operation, reflowing the solder bumps so as to permanently attach solder bumps to traces. FIG. 1 shows a cross section of a flip chip 10 attached to a substrate 11. Each solder bump 12 is attached to a metal trace (not shown) on the substrate 11. After the flip chip 10 is attached to the 10 substrate 11, the space between the flip chip and the substrate is commonly filled with a material known as underfill 13. The underfill material is selected for its mechanical properties so that it redistributes the mechanical and thermnomechanical stresses arising between the flip chip 10 and the substrate 11. Thus the underfill 13 protects the flip chip 10 from mechanical damage.

In copending application Ser. No. 09/031,167 an invention is disclosed in which protection from mechanical damage is provided in a different way from that just described. A resilient protective layer is applied to the semiconductor wafer before the solder bumps are formed. After the flip chip has been attached to a substrate, the resilient protective layer protects the solder bumps and adjacent regions of the flip chip from mechanical damage arising from mechanical and thermnomechanical stresses arising between the flip chip and the substrate. The resilient layer provides protection against mechanical damage while avoiding the use of underfill. Thus the expense of providing underfill is avoided.

Now, without underfill, the circuit side of the flip chip is exposed to whatever ambient light enters the space between flip chip and substrate. Ambient light includes natural daylight and lamplight. Some flip chips can operate satisfactorily in ambient light. However, some other flip chips are so sensitive to light that their electrical characteristics are altered to an unacceptable degree. These light sensitive flip chips must be isolated from ambient light. Thus a need exists for protection for light sensitive flip chips from ambient light.

SUMMARY OF THE INVENTION

Disclosed herein is a flip chip that comprises a plurality of electrical terminals, each electrical terminal comprising a bonding pad, an under bump pad on the bonding pad, and a solder bump on the under bump pad. Each under bump pad is a portion of an under bump layer. The flip chip further comprises a light shield. The light shield is also a portion of the under bump layer. The light shield portion of the under bump layer is opaque to ambient light and is generally separated from each of the under bump portions of the under bump layer. The under bump layer includes at least one layer of conductive material, and may include multiple layers of conductive materials.

A passivation layer of mechanically resilient insulator material may be present on the wafer before the under bump layer is deposited.

A second layer of mechanically resilient insulator material may be deposited on the light shield.

Alternatively, a layer of titanium or other material that prevents wetting of the light shield by solder may be deposited on the light shield.

The light shield covers at least the light sensitive portions of the flip chip integrated circuit. The area covered by the light shield may a small fraction or a large fraction of flip chip surface.

Thus a flip chip integrated circuit is provided that has self-contained protection from ambient light and that does not require the use of backfill.

BRIEF DESCRIPTION OF THE DRAWINGS

The present invention may best be understood by reference to the following description taken together with the drawings. For the sake of clarity the drawings are not to scale.

DETAILED DESCRIPTION OF THE INVENTION

In the following description, numerous specific details are set forth in order to provide a thorough understanding of the present invention. In view if this description, it will be obvious to one skilled in the art that the present invention may be embodied in a wide variety of specific configurations. Also, in order not to unnecessarily obscure the present invention, well known integrated circuit manufacturing steps are not described in detail herein.

Figure 1:
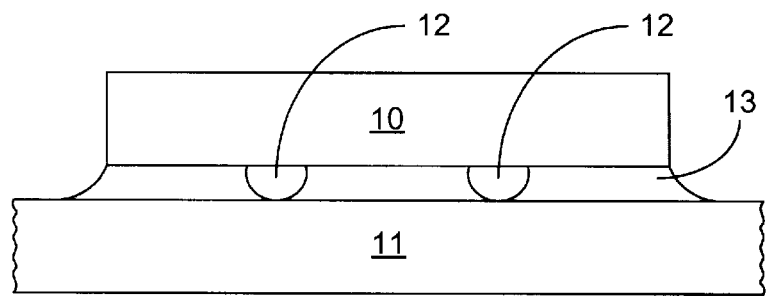
FIG. 1 is a cross section view showing underfill between a flip chip and a substrate as in the prior art.
Figure 2:
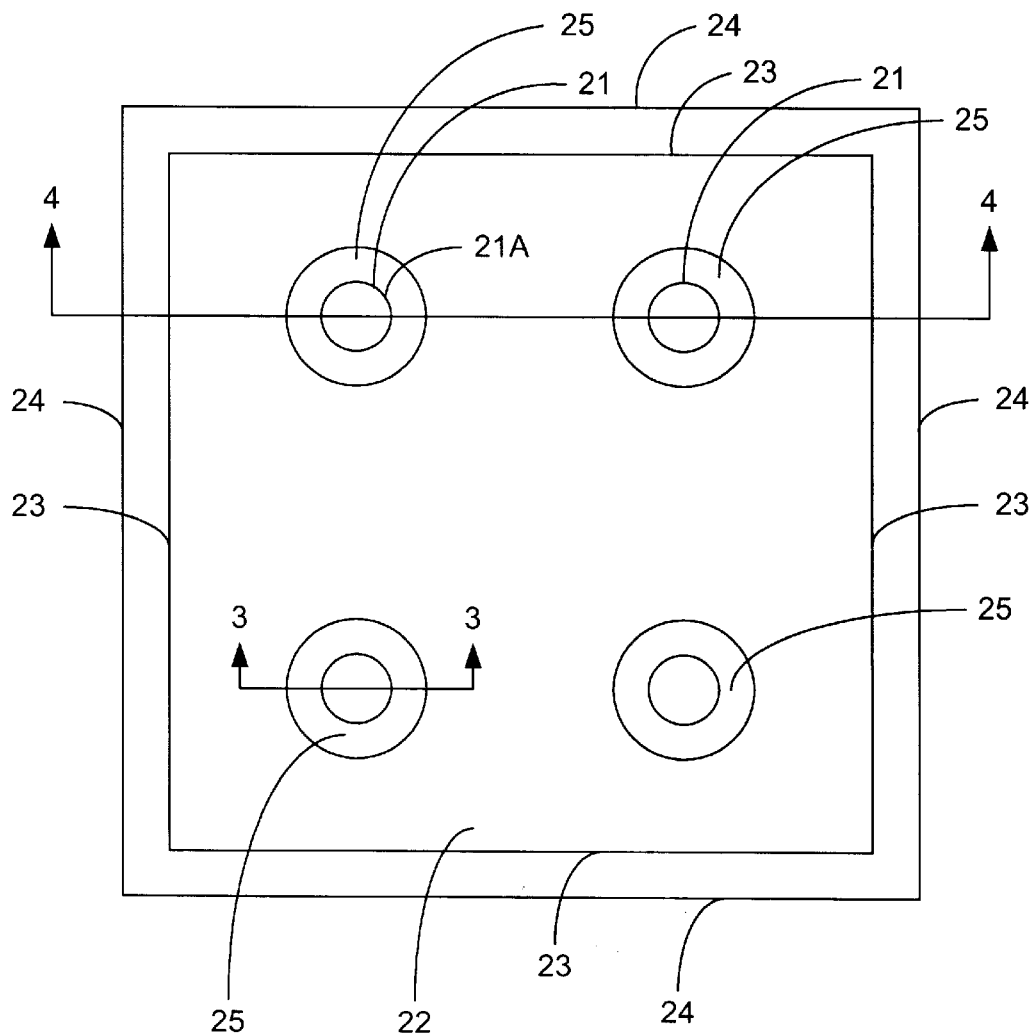
FIG. 2 is a plan view of a flip chip in accordance the present invention.

FIG. 2 is a plan view of the top surface of a flip chip 20 in accordance with the present invention. The flip chip 20 is shown after it has been cut from a semiconductor wafer (not shown). Solder bumps 21 and a light shield 22 are shown on the surface of the flip chip 20. The light shield 22 is a portion of an under bump metal layer and is opaque to ambient light. The under bump metal layer is removed from the areas 25 between the solder bumps 21 and the light shield 22 so as to prevent electrical conduction between solder pads 21 and light shield 22. The under bump metal layer is also removed from the area 23 around the periphery of the flip chip 20, so as to leave a clear area for sawing the wafer into separate flip chips.

FIGS. 3A through 3E show various embodiments of the invention.

Figure 3A:
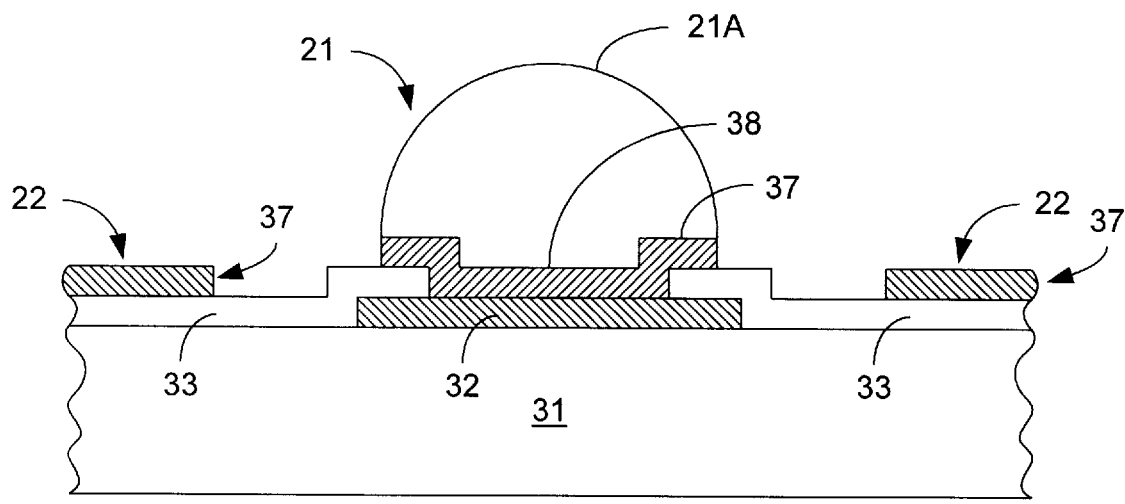
FIG. 3A is a cross section view, taken as indicated in FIG. 2, showing a portion of a flip chip in accordance wit the present invention.

FIG. 3A is a cross section, taken as indicated in FIG. 2, showing a portion 30 of a flip chip in a first embodiment of the present invention. Substrate 31 is a portion of the semiconductor wafer from which the flip chip 20 is cut. A bonding pad 32 is shown on the substrate 31. The bonding pad 32 is formed by depositing a conductive layer, such as aluminum, and then selectively etching the layer. A passivation layer 33, consisting of suitable insulating material, is deposited over the substrate 31 and over the bonding pad 32. A via 34 is formed in the passivation layer 33 over the bonding pad 32. For the sake of clarity, structures that are commonly formed in integrated circuits beneath the passivation layer 33 and beneath the bonding pad 32 are not shown in FIG. 3A. An under bump layer 37 of suitable conductive material is deposited over the wafer and etch patterned to form under bump pad 38 and light shield 22. It is a feature of the present invention that the light shield 22 and the under bump pad 38 are formed from the same under bump layer 37. A solder bump 21 is formed on each under bump pad 38. Electrical terminal 21A includes a solder bump 21, an under bump pad 38 and a bonding pad 32. The light shield 22 is located so as to block ambient light from reaching light sensitive portions (not shown in FIG. 3A) of the integrated flip chip.

Figure 3B:
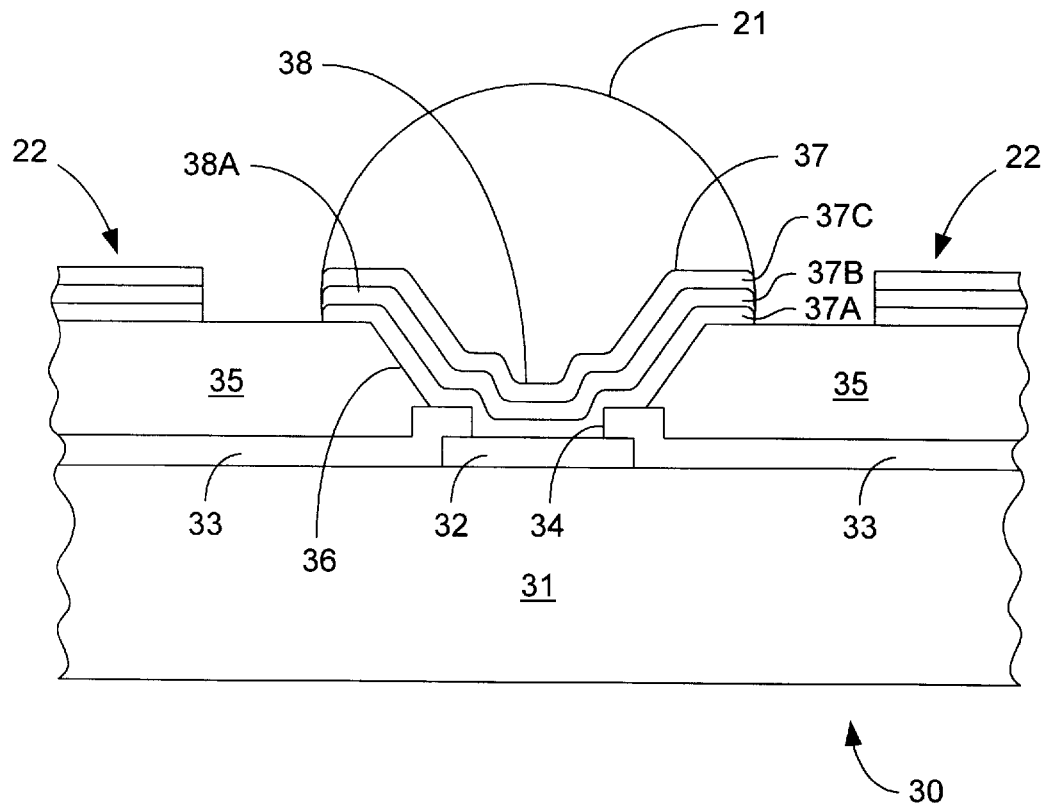
FIG. 3B is a cross section view, taken as indicated in FIG. 2, showing a portion of a flip chip in accordance with the present invention.

FIG. 3B is a cross section, taken as indicated in FIG. 2, of a portion 30 of a flip chip 20 in a second embodiment of the present invention. Substrate 31 is a portion of the semiconductor wafer from which the flip chip 20 is cut. A bonding pad 32 is shown on the substrate 31. The bonding pad 32 is a portion of a deposited conductive layer. A passivation layer 33 of suitable insulating material is deposited over the substrate 31 and over the bonding pad 32. A via 34 is formed in the passivation layer 33 over the bonding pad 32. For the sake of clarity, components such as transistors, which are formed on the substrate 31, are not shown in FIG. 3B. Also, and again for the sake of clarity, layers of conductive and insulating materials located between the substrate 31 and the passivation layer 33 and between the substrate 31 and the bond pad 32 are not shown. A layer of mechanically resilient insulating material 35 is deposited over the passivation layer 33 and on the exposed portion of the bonding pad 32. A via 36 is formed in the resilient layer 35, exposing again the surface of bonding pad 32. An under bump layer 37 of conductive material is deposited over the resilient layer 35 and over the exposed portion of the bonding pad 32. Under bump layer 37 includes, in this embodiment, an aluminum layer 37A, a nickel-vanadium layer 37B, and a copper layer 37C. Under bump metal layer 37 is patterned in a conventional manner to leave an under bump pad 38 on each bonding pad 32. Under bump pad 38 also extends over a portion of the resilient layer 35 to form a lip 38A around the via 36. A solder bump 21 is formed on the under bump pad 38. As described in copending application Ser. No. 09/031,167, the resilient layer 35 protects the flip chip from mechanical damage arising from mechanical and thermo-mechanical stresses which occur after the die has been mounted on a substrate such as a printed circuit board. As further described in the above referenced copending application, the lip 38a provides further protection against mechanical damage. Electrical terminal 21A includes solder bump 21, under bump pad 38, and bonding pad 32.

In a preferred embodiment of the present invention, the bonding pad 32 is part of a layer of aluminum or aluminum alloy, the passivation layer 33 is a layer of silicon dioxide which is about 1.6 microns thick, and the resilient layer 35 is a layer of polyimide which is about 4.6 microns thick. The under bump layer 37 includes three layers of metal, these being, a layer of aluminum 37A which is about 1.0 microns thick, a layer of nickel-vanadium 37B which is about 0.3 to 0.4 microns thick, and a layer of copper 37C which is about 0.4 microns thick. The solder bump 21 is made of a eutectic mixture of lead and tin. A layer of nickel may be used in place of the layer of nickel-vanadium 37B.

In another preferred embodiment of the present invention, the passivation layer 33 is a layer of silicon nitride and the resilient layer 35 is a layer of benzocyclobutene. Benzocyclobutene has the advantage that it can be patterned directly without the use of an additional photoresist layer.

Figure 3C:
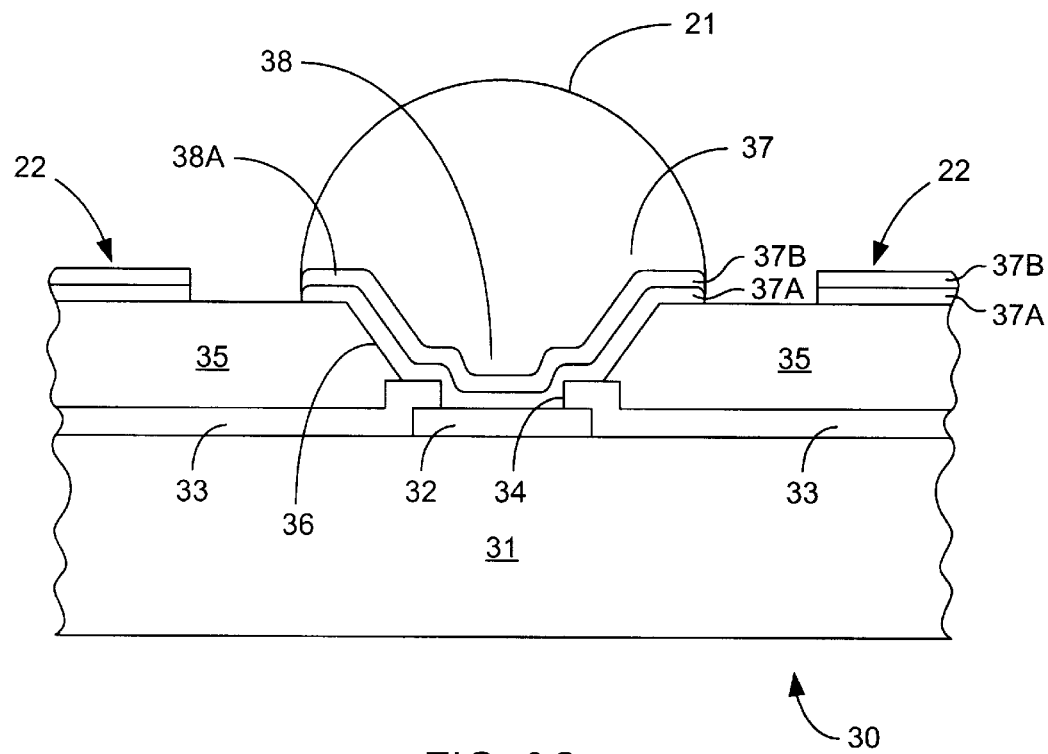
FIG. 3C is a cross section view, taken as indicated in FIG. 2, of a portion of a flip chip in accordance with the present invention.

FIG. 3C is a cross section view, taken as indicated in FIG. 2, showing a portion of a flip chip 20 in a third embodiment of the present invention. In FIG. 3C, under bump layer 37 includes two layers, these being a chromium layer 37A and a copper-chromium layer 37B. In this embodiment the solder bump 21 is attached to the copper-chromium layer 37B.

Figure 3D:
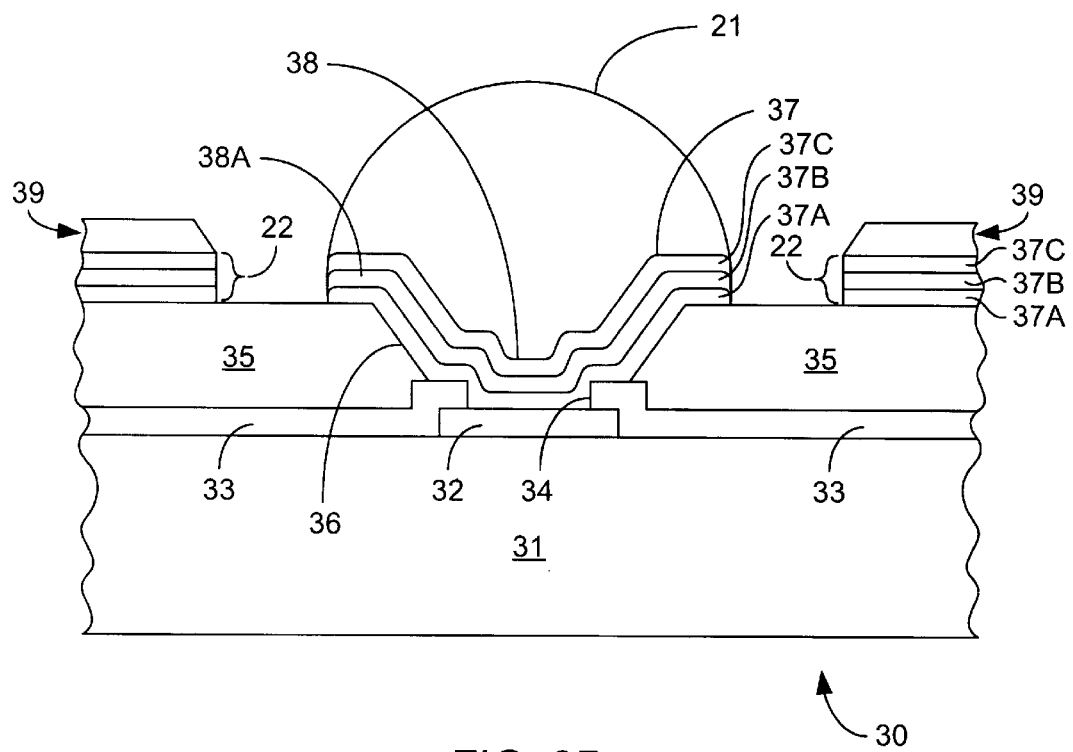
FIG. 3D is a cross section view, taken as shown in FIG. 2, showing a portion of a flip chip in accordance with the present invention.

FIG. 3D is a cross section view, taken as indicated in FIG. 2, showing a portion of a flip chip 20 in a fourth embodiment of the present invention. In this embodiment, a layer of titanium 39 is formed on the copper layer 37C on the light shield 22. The titanium layer 39 prevents solder from adhering to the light shield 22 during the formation of solder bumps 21. The titanium layer 39 also prevents solder from adhering to the light shield while the flip chip is being attached to a substrate such as a printed circuit board.

Figure 3E:
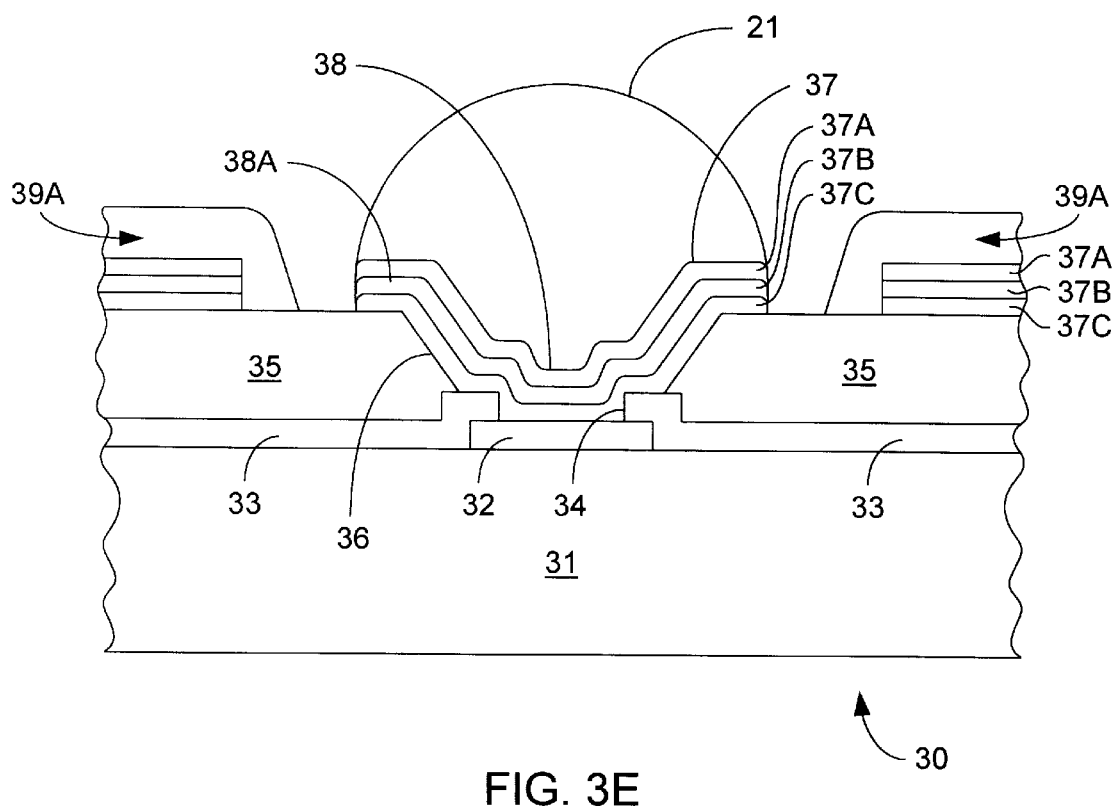
FIG. 3E is across section view, taken as indicated in FIG. 2, showing a portion of a flip chip in accordance with the present invention.

FIG. 3E is a cross section view, taken as indicated in FIG. 2, showing a portion of a flip chip in a fifth embodiment of the present invention. In this embodiment, a second layer of benzocyclobutene passivation 39A is formed to cover the light shield 22, leaving openings where solder bumps 21 are formed.

Materials other than those named in the preferred embodiments can be used in each of the parts enumerated in FIGS. 3A, 3B, 3C, 3D, and 3E, while remaining within the scope of the present invention. For example, the substrate 31 may be a substrate of any suitable material, including any suitable semiconductor material. Bonding pad 32 may be formed of any suitable conductive material such as, for example, aluminum-copper, aluminum-silicon or aluminum-copper-silicon, and the passivation layer 33 may be formed of any suitable insulating material. The resilient layer 35 may be formed of any suitable mechanically resilient insulating material. The under bump layer 37 may be formed of layers any suitable conductive materials.

Figure 4:
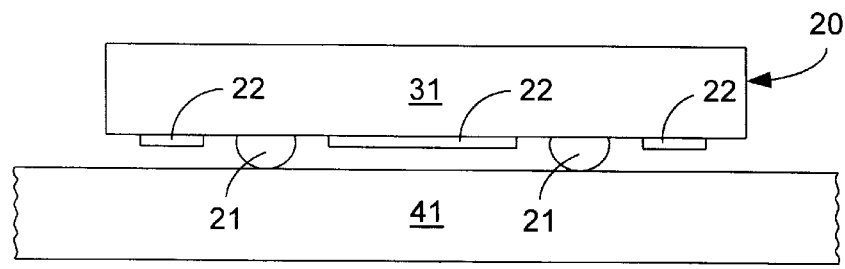
FIG. 4 is a cross section view, taken as indicated in FIG. 2, of a flip chip in accordance with the present invention, and a substrate to which the flip chip is attached.

FIG. 4 is a cross section, taken as indicated in FIG. 2, of a flip chip 20 in accordance with the present invention and of a substrate 41 on which the flip chip 20 is mounted. In FIG. 4, the flip chip 20 includes a substrate 31, solder bumps 21 and light shield 22. The solder bumps 21 are attached to conductive traces (not shown) on the substrate 41 and thus the flip chip 20 is attached to the substrate 41. Ambient light, whether natural or artificial, is free to enter the space between the substrate 41 and the flip chip 20. The light shield 22 is opaque to ambient light and prevents light from penetrating to light sensitive portions of the flip chip. Thus the electrical characteristics of the flip chip are not significantly changed by ambient light. Thus there is no need for underfill and the cost of providing underfill is avoided.

Figure 5:
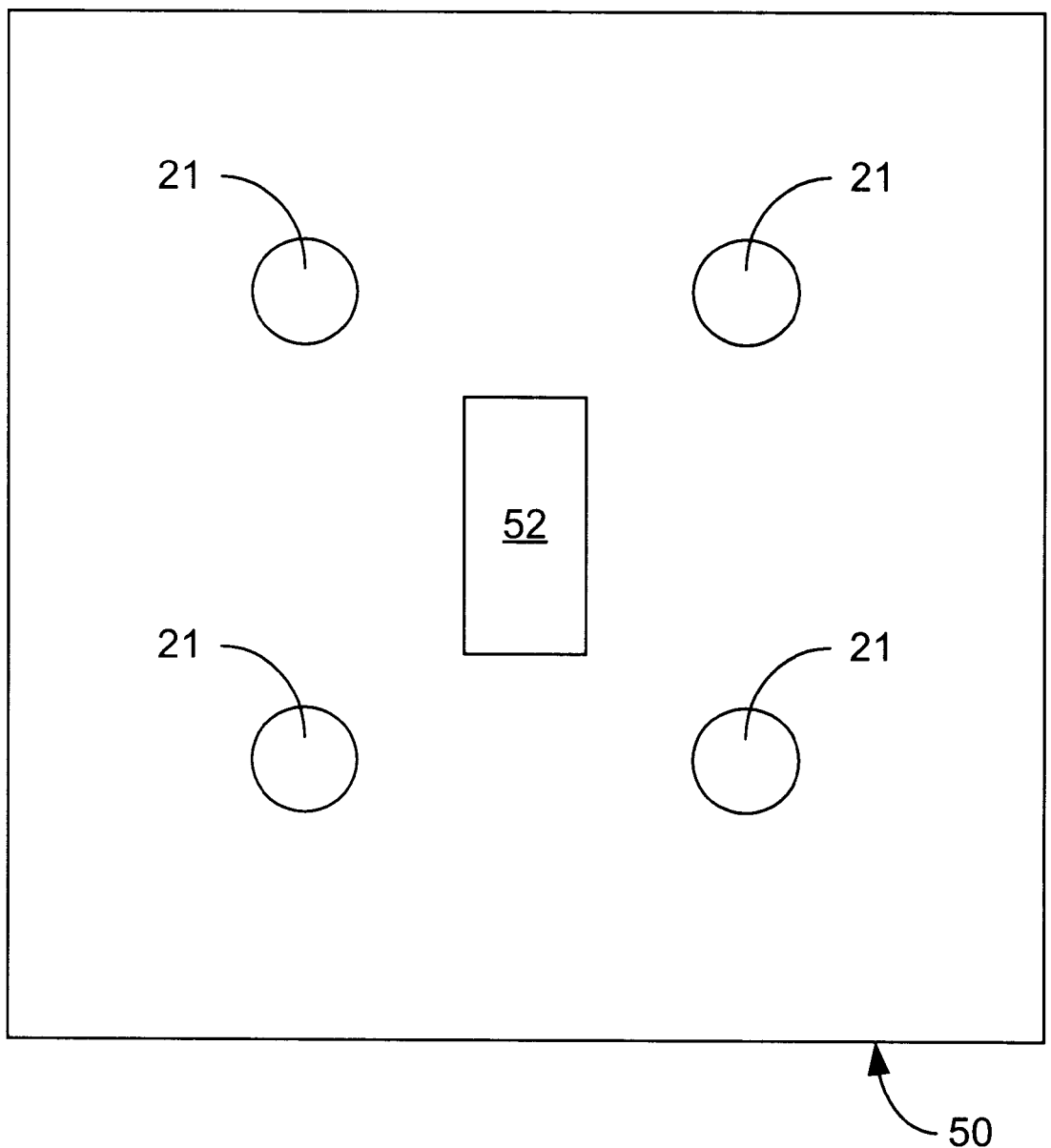
FIG. 5 is a plan view of a flip chip in accordance with the present invention.

FIG. 5 is a plan view of the surface of a flip chip in accordance with the present invention. In FIG. 5 solder bumps 21 are shown on the surface of the flip chip 50 and a light shield 52 is shown covering a portion of the surface of the flip chip 50. FIG. 5 should be compared with FIG. 2. In FIG. 2 the light shield 22 covers almost all of the surface of the Rip chip apart from the solder bumps 21, whereas in FIG. 5 the light shield 52 covers a much smaller portion of the surface of the flip chip 50. The configuration shown in FIG. 5 is appropriate when the portion of the die that is sensitive to light is covered by the smaller light shield 52. The light shield 52 is a portion of the under bump layer.

Although only a few embodiments of the present invention have been described in detail, it should be understood that the present invention may be embodied in many other specific forms without departing from the spirit or scope of the invention. Therefore, the present examples are to be considered as illustrative and not restrictive, and the invention is not to be limited to the details given herein but may be modified within the scope of the appended claims.

What is claimed is:

1. A flip chip comprising:
   a plurality of electrical terminals, each electrical terminal comprising a bonding pad, a conductive under bump pad, and a solder bump, the conductive under bump pad being a portion of a conductive under bump layer; and
   a light shield, the light shield being another portion of the conductive under bump layer, the light shield being formed of the same material as the conductive under bump pad.

2. The flip chip of claim 1 wherein the light shield is opaque to ambient light.

3. The flip chip of claim 1, wherein the light shield covers light sensitive portions of the flip chip.

4. The flip chip of claim 1 further comprising a layer of mechanically resilient insulating material located beneath the light shield.

5. The flip chip of claim 4 wherein the mechanically resilient insulating material is benzocyclobutene.

6. The flip chip of claim 1, wherein the under bump layer comprises a layer of aluminum, a layer of nickel-vanadium and a layer of copper.

7. The flip chip of claim 1 further comprising a layer of material that resists wetting by solder and that is located on the light shield.

8. The flip chip of claim 7 wherein the layer of material that resists wetting by solder is a layer of titanium.

9. The flip chip of claim 4 further comprising a second layer of mechanically resilient insulating material located above the light shield.

10. The flip chip of claim 9 wherein the second layer of mechanically resilient insulating material is a layer of benzocyclobutene.

11. The flip chip of claim 1 wherein the under bump layer comprises a layer of aluminum, a layer of nickel and a layer of copper.

12. The flip chip of claim 11 further comprising a layer of titanium located on the light shield.

13. The flip chip of claim 1 wherein the conductive under bump pad and light shield are physically separated such that electricity does not flow between the conductive under bump pad and the light shield.

14. The flip chip of claim 1 wherein the conductive under bump pad is centered upon the bonding pad, and the solder bump is centered upon the conductive under bump pad such that the bonding pad, the conductive under bump pad and the solder bump are formed along a single axis.

* * * * *